(12) United States Patent
Bhatti et al.

(10) Patent No.: US 6,424,531 B1
(45) Date of Patent: Jul. 23, 2002

(54) HIGH PERFORMANCE HEAT SINK FOR ELECTRONICS COOLING

(75) Inventors: Mohinder Singh Bhatti, Amherst; Shrikant M. Joshi, Williamsville; Russell S. Johnson, Tonawanda, all of NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 09/888,753

(22) Filed: Jun. 25, 2001

Related U.S. Application Data (60) Continuation-in-part of application No. 09/804,741, filed on Mar. 13, 2001, which is a division of application No. 09/804,756, filed on Mar. 13, 2001.

(51) Int. Cl.⁷ .................................. H05K 7/20
(52) U.S. Cl. ................ 361/704; 361/707; 361/712; 257/706; 257/709; 165/80.3; 165/185
(58) Field of Search .................. 361/687, 690–695, 361/702–712, 714–719; 165/80.2, 80.3, 80.4, 165, 185; 257/706–727, 659, 778, 786–787, 795–797; 174/16.3

(56) References Cited

U.S. PATENT DOCUMENTS

| | | | |
|---|---|---|---|
| 3,616,841 A | 11/1971 | Walz | 164/34 |
| 3,946,039 A | 3/1976 | Walz | 264/332 |
| 4,715,438 A | * 12/1987 | Gabuzda et al. | 165/185 |
| 4,808,558 A | 2/1989 | Park et al. | 501/80 |
| 5,932,925 A | * 8/1999 | McIntyre | 257/719 |

OTHER PUBLICATIONS

Article: "Foam Enhanced Heat Sink", IBM Technical Disclosure Bulletin, Apr. 1996 US, vol. 39, issue 4, pp. 101–102.*

Bastawros, "Effectiveness of open–cell metallic foams for high power electronic cooling," Presented a IMECE, Nov. 15–20, 1998, Anaheim, CA, in Thermal Management of Electronics, ASME Conf. Proc. HTD–361–3/PID–3, 211–217.

Bastawros et al, "Evaluation of cellular metal heat transfer media," MECH 325, Mar. 1998 for review for publication in the Journal of Heat Transfer.

* cited by examiner

Primary Examiner—Darren Schuberg
Assistant Examiner—Michael Datskovsky
(74) Attorney, Agent, or Firm—Patrick M. Griffin (57) ABSTRACT

Heat sinks are provided that achieve very high convective heat transfer surface per unit volume. These heat sinks comprise a spreader plate, at least three fins arranged radially around the spreader plate and an array of porous reticulated foam blocks that fills the space between adjacent fins.

19 Claims, 4 Drawing Sheets

HIGH PERFORMANCE HEAT SINK FOR ELECTRONICS COOLING

CROSS-REFERENCE TO RELATED APPLICATIONS

This application is a continuation-in-part of U.S. patent application Ser. No. 09/804,741, filed Mar. 13, 2001, which is a Div. of Ser. No. 09/804,756 filed Mar. 13, 2001.

TECHNICAL FIELD

The present invention is directed to heat sinks primarily for use in dissipating waste heat generated by electrical and/or electronic components and assemblies. These heat sinks include a heat spreader plate and an assembly of heat conducting fins and reticulated foam structures that are bonded together. The foam block may be continuous blocks situated between two adjacent fins along the length of the fins or may be an array of short-length blocks having intervening gaps along the length of the fins. Electronic components are connected to one surface of the spreader plate with the assembly of fins and foam connected to another surface of the spreader plate that comes into contact with a cooling fluid.

BACKGROUND OF THE INVENTION

High power electrical and electronic components continue to have an increasing demand for higher power dissipation within a relatively confined space. In order to provide for such higher power dissipation requirements while remaining suitably compact, several levels of thermal management are usually required at the device, sub-assembly and component level.

Figure 1:
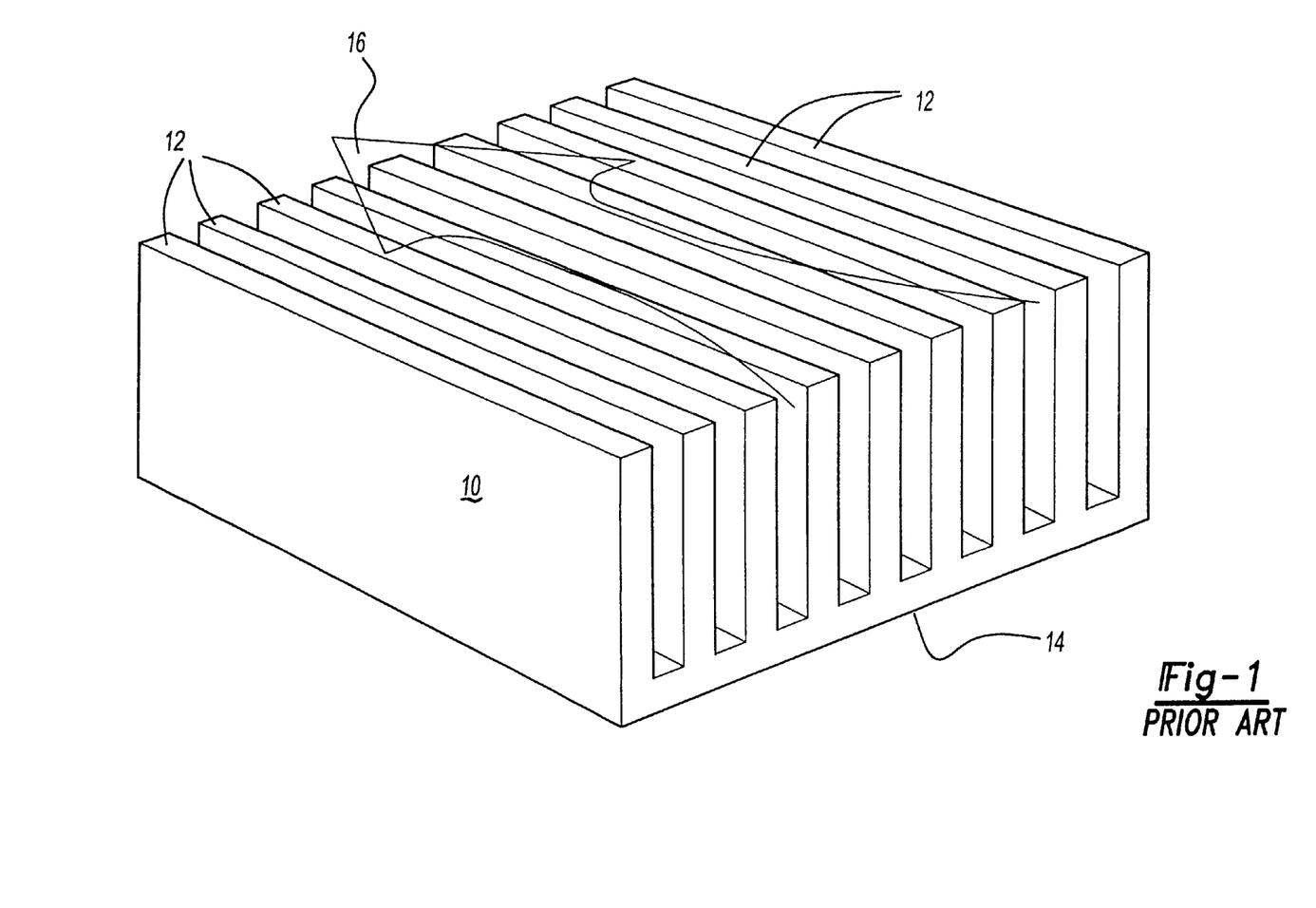
FIG. 1 shows a typical heat sink of the prior art.

At the component level, various types of heat exchangers and heat sinks have been used that apply natural or forced convection or other cooling methods. A typical heat sink for electrical or electronic components is depicted in FIG. 1. As shown, the heat sink 10 includes a spreader plate 14 to which metal fins 12 are attached. An electronic component is attached to spreader plate 14 of heat sink 10 and a cooling fluid 16, such as air or water, is passed through fins 12 to dissipate the heat generated by the electronic component. For a given power level to be dissipated, the spreader plate size (i.e., area) and the fin length along the length of the cooling flow path can be calculated using known methods. Fin spacing and fin height are usually determined by known methods such as numerical modeling.

In heat sinks for low power density microelectronics such as computer chips, the chip is bonded directly onto the heat sink via an interface. More advanced heat sinks for high power density computer chips employ a separate spreader plate onto which is bonded the chip via an interface. The spreader plate/chip assembly is then bonded onto the heat sink via another interface. The presence of two interfaces significantly increases the overall thermal resistance to heat transfer from the chip to the coolant flow.

In demanding applications, the method of heat exchange is usually forced convection to the cooling fluid. In such systems, heat exchange can be improved by increasing the fin surface area exposed to the cooling fluid. This is accomplished by increasing the number of the fins per unit volume. However, there are limitations to achievable fin densities based upon manufacturing constraints and cooling fluid flow requirements.

Reticulated foams are also known in the art for their ability to conduct heat such as the metal foams disclosed in U.S. Pat. Nos. 3,616,841 and 3,946,039 to Walz, and the ceramic foams disclosed in U.S. Pat. No. 4,808,558 to Park et al. Metal foams have been sold under the trade name DUOCEL available from Energy Research and Generation, Inc., Oakland, Calif.

Until recently, metal and ceramic reticulated foams have not been adapted for use in heat sinks for dissipating waste heat from electronic components. However, these structures, especially when comprised of metal, make excellent heat exchangers because of their conductivity and their extremely high surface area to volume ratio. While earlier porous heat exchangers had up to 100 open cells per square inch, reticulated foam has up to 15,625 open cells per square inch. Reticulated foam is far more porous and has far more surface area per unit volume (1600 square feet/cubic foot) than heat exchangers having other structures. The pressure drop of fluids flowing through reticulated foam is also relatively low so that movement of a cooling fluid through the foam is practical.

Studies by Bastawros have now shown the efficacy of metallic foams in forced convection heat removal for cooling of electronics. See, Bastawros, A.-F., 1998, *Effectiveness of Open-Cell Metallic Foams for High Power Electronic Cooling,* ASME Conf. Proc. HTD-361-3/PID-3, 211–217, and Bastawros, A.-F., Evans, A. G. and Stone, H. A., 1998, *Evaluation of Cellular Metal Heat Transfer Media,* Harvard University report MECH 325, Cambridge, Mass. Bastawros demonstrated that the use of metallic foam improved heat removal rate with a moderate increase in the pressure drop. Bastawros' results were based on thermal and hydraulic measurements (on an open cell aluminum alloy foam having a pore size of 30 pores per inch) used in conjunction with a model based upon a bank of cylinders in cross-flow to understand the effect of various foam morphologies. The model prediction was extrapolated to examine the trade-off between heat removal and pressure drop. The measurements showed that a high performance cellular aluminum heat sink (i.e., aluminum foam) removed 2–3 times the usual heat flux removed by a pin-fin array with only a moderate increase in pressure drop.

SUMMARY OF THE INVENTION

A range of new heat sinks for electrical and electronic components is herein presented that provides for space-efficient heat exchange with low thermal resistance. These heat sinks are capable of removing the increased waste heat flux generated by today's higher power electronic systems.

In general, heat sinks of the present invention comprise a spreader plate, at least three fins and porous reticulated foam block that fill the space between the fins. The foam block may be continuous single blocks situated between adjacent fins or may be an array of several short-length blocks having intervening gaps in-between blocks along the length of the fins. All materials are made from a heat conducting material. The fins and foam block form an assembly that is connected to one surface of the spreader plate. Electronic components to be cooled are preferably connected to an opposing surface of the spreader plate, but may be connected to any surface of the spreader plate suited for heat transfer.

In the present invention, the preferred dimensional length is defined for the foam blocks used, whether they comprise continuous single foam blocks (hereinafter referred to as "continuous block") or an array of short-length foam blocks (hereinafter referred to as "interrupted block"). The present invention also defines relationships for establishing the optimum fin height for the heat sinks provided herein. Due to the radial design of the present heat sinks, fin spacing is determined by the number of fins selected. Devices produced herein find particular use in cooling microelectronic components such as microprocessors.

DESCRIPTION OF THE PREFERRED EMBODIMENT

By the present invention, it has been discovered that heat sinks that use a combination of solid non-porous fins and highly porous reticulated foam can provide improved performance over known applications that use one or the other. It is fully contemplated that any combinations of fins and reticulated foam may be used in a wide variety of different applications to achieve improved cooling.

It has been further discovered that there are constraints on the volume and geometry of reticulated foam beyond which the use of additional foam will have little impact on the overall heat sink's ability to dissipate thermal power at a given flow rate (i.e., the performance). This is because the reticulated foam is not a fully dense material (e.g., aluminum foam has a density of about 10% of solid aluminum). Therefore, a high convective heat transfer surface area is achieved at the expense of reduced thermal conductivity.

Additionally, in microelectronic cooling applications such as for example for microprocessors, practical considerations relative to package size, air flow rate, pressure drop and noise limits can impose further constraints on possible configurations and dimensions. Nonetheless, using the methods of the present invention, suitable heat sinks can be produced.

Figure 2A:
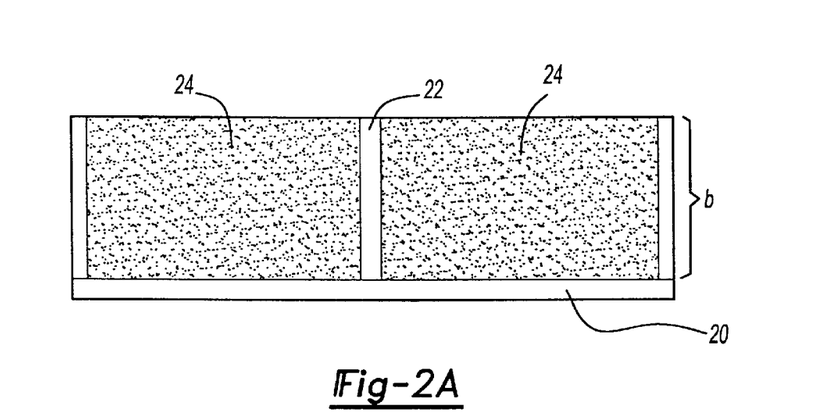
FIGS. 2A and 2B show the elevation and plane views of an improved heat sink of the present invention that comprises continuous (singular) foam blocks.
Figure 2B:
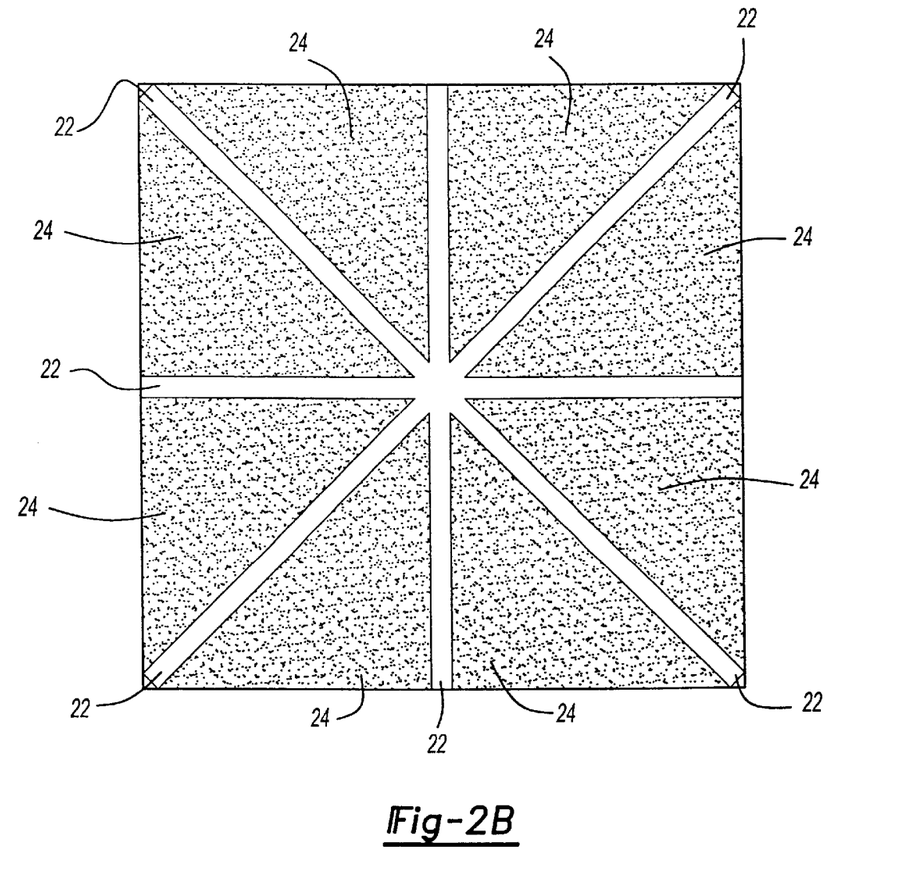

Heat sinks of the present invention achieve very high convective heat transfer surface per unit volume. These heat sinks comprise a spreader plate, at least three fins and porous reticulated foam block that fill the space between the fins. The foam block may be continuous blocks that fill the space between adjacent fins, as shown in FIGS. 2A and 2B, or may be arrays of interrupted blocks having gaps in-between successive blocks along the radial fin length, as shown in FIG. 3B. These basic structures may be expanded to any configurations comprising foam blocks in-between fins that are radially mounted onto the surface of a spreader plate.

Primary heat transfer to the cooling fluid is by convection from the foam, with the fins and spreader plate being used to conduct heat from the connected heat source (i.e., the electronic component) into the foam. In air-to-air heat exchange (i.e., where air is being used as the cooling fluid), ambient air may be drawn in through the foam's open vertical side walls and exhausted through the foam's top surface, or vice versa.

A preferred embodiment of the present invention is shown in FIG. 2A and FIG. 2B. As shown, the device comprises a heat spreader plate 20, with fins 22 and reticulated foam blocks 24 filling the space in-between the fins. The fins 22 and foam blocks 24 form an assembly that is mounted onto one surface of the spreader plate 20, leaving an opposing surface free for contact with an electronic component to be cooled.

Referring to FIG. 2A fins 22 are mounted so that they are substantially perpendicular to the spreader plate 20. Foam blocks 24 are mounted in-between fins 22 to fill the width region that defines the horizontal space between adjacent fins. The foam blocks 24 also preferably fill the height region that defines the vertical space between adjacent fins to the height of the fins 22.

Figure 4A:
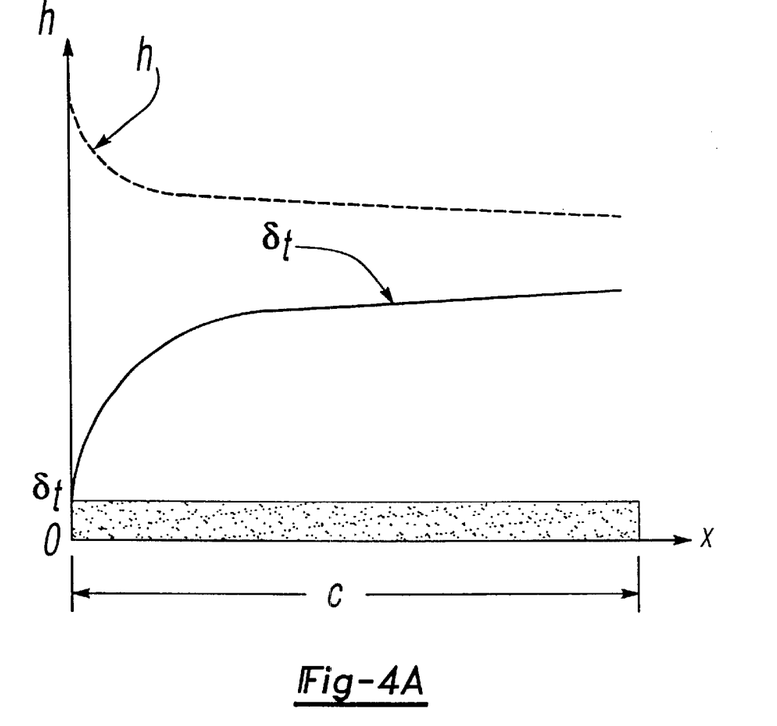
FIGS. 4A and 4B are graphs that show the heat transfer characteristics of continuous blocks and interrupted blocks, respectively.
Figure 4B:
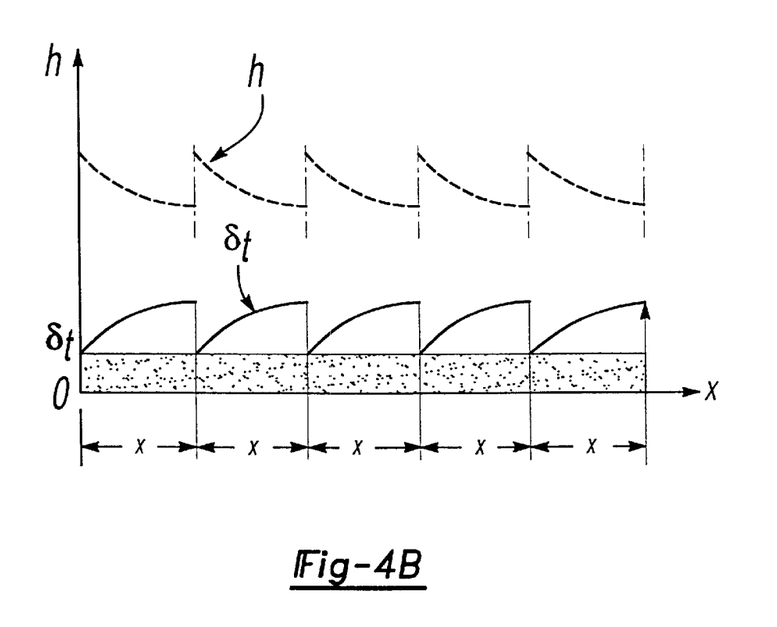

Although the foam blocks are an open-cell material, it has been found that heat transfer through the reticulated foam follows the heat transfer characteristics of a solid substrate material bonded to foam as depicted in FIGS. 4A and 4B. The upward sloping solid line in FIG. 4A (lower curve) shows the growth of the thermal boundary layer thickness $\delta_t$ on a substrate with a long foam block of length c in the flow direction indicated by the arrow. The downward sloping dashed line in FIG. 4A (upper curve) on the other hand, shows the variation of the heat transfer coefficient h over the same foam block. It is seen from the opposing trends of the two curves that as the thermal boundary thickness increases, the heat transfer coefficient decreases. In other words, as the thermal boundary layer thickness increases, the resistance to heat transfer increases since the thermal boundary layer thickness is a direct measure of resistance to heat transfer. The smaller the boundary layer thickness the smaller is the resistance to heat transfer.

The upward sloping solid lines in FIG. 4B (lower curves) show the growth of the thermal boundary layers on a substrate with an array of short foam blocks each of length x in the flow direction indicated by an arrow. The dotted lines in FIG. 4B (upper curves), on the other hand, show the variation of the heat transfer coefficient h over the same array of foam blocks. This heat transfer coefficient curve resembles a saw tooth wave. The explanation of this saw tooth nature of the heat transfer coefficient curve is that due to repeated interruption of the fluid flow at the trailing edge of each short foam block, the thermal boundary layer starts developing anew at the leading edge of the succeeding foam block. Thus, the overall thermal boundary layer thickness $\delta_t$ never gets a chance to grow very thick and consequently the heat transfer coefficient remains fairly high over the entire length of the solid substrate. By appropriately selecting the foam block length x in the flow direction, the heat transfer rate from the substrate can be maintained at the desired level.

The foam block length x determined herein represents the preferred upper threshold, with lengths less than x being more preferred. Nonetheless, it should be recognized that the present invention may still be practiced by selecting foam block lengths of x greater than the preferred upper threshold.

Therefore, according to a preferred alternative embodiment of the present invention, an array of short blocks of foam, or "interrupted" blocks, are used to obtain the desired heat transfer. Formulas to establish a preferred upper threshold for the length x of such interrupted blocks are provided herein.

Figure 3A:
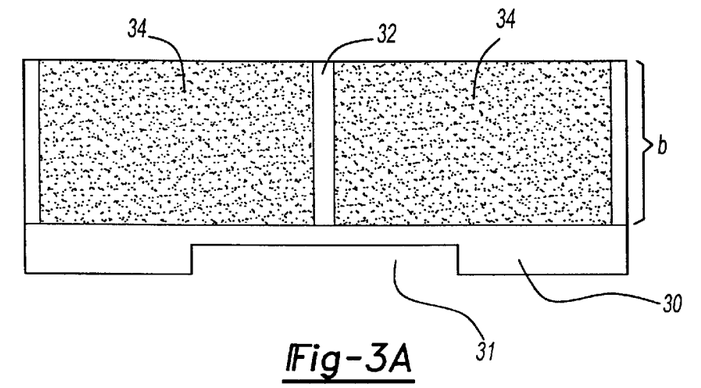
FIGS. 3A and 3B show the elevation and plane views of an improved heat sink of the present invention that comprises arrays of interrupted (short-length) foam blocks.
Figure 3B:
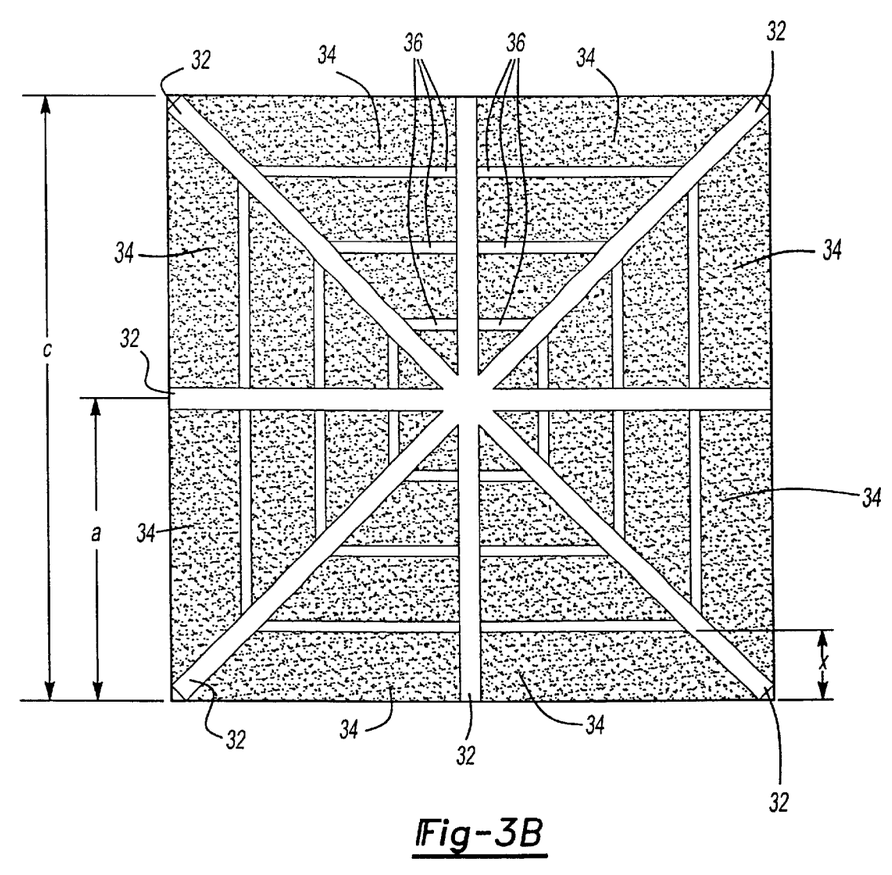

The alternative embodiment of the present invention is shown in FIGS. 3A and 3B. As shown, the device comprises a heat spreader plate 30 that preferably includes a recessed area 31 suitable for placement and attachment of a microelectronic component such as a computer chip. The recessed area 31 eliminates the typical interface between the heat sink and the spreader plate used for high power density chips, thereby reducing the overall thermal resistance to heat transfer from the chip to the coolant flow. As further shown, the device comprises fins 32 and arrays of interrupted blocks 34 having gaps 36 in-between successive interrupted blocks 34 that fill the space between adjacent fins 32 along the radial length of the fins 32. While it is preferred the interrupted blocks 34 are all of approximately equivalent length, it is contemplated that the blocks 34 at either end may be selected to be shorter than other blocks 34 to accommodate for sizing of the selected spreader plate 30. The fins 32 and the interrupted blocks 34 form an assembly that is mounted onto the surface of spreader plate 30 that is opposite to the surface having the recessed area 31.

Referring to FIG. 3A, fins 32 are mounted so that they are substantially perpendicular to the spreader plate 30. Interrupted blocks 34 are mounted in-between adjacent fins 32 leaving a gap 36 between successive interrupted blocks 34 as shown in FIG. 3B. The size of the gap 36 is unimportant, but it is preferred that it be as small as possible. The interrupted blocks 34 also preferably fill the height region that defines the vertical space between adjacent fins 32 to the height of the fins 32.

While FIGS. 2A and 3A show that the foam blocks 24 and interrupted blocks 34 fill the height region, it is contemplated that in alternative embodiments the blocks 34 may partially fill or overfill the height region.

Referring to FIGS. 2B and 3B, heat sinks of the present invention are configured such that the fins 22 and 32 are in a substantially radial configuration. In more preferred embodiments, the fins 22 and 32 are also equidistant from one another around spreader plate 20, 30.

The selection of spreader plate size and fin length along the cooling flow length, for a given power dissipation requirement, follow those techniques known in the art. The overall dimensions of the spreader plate are generally fixed based on the amount of heat to be dissipated from the surface of the heat source (such as a computer chip). The spreader plate surface area should be such that, for a prescribed flow rate of the cooling fluid flowing over the spreader plate, the heat from the heat source is able to spread to the edges of the spreader plate. Additional considerations may also be determinative of the spreader plate surface area such as packaging constraints.

Generally, however, spreader plate surface area is selected by multiplying the surface area of the heat source with the area magnification factor. The area magnification factor $\lambda = A_s/A_h$ represents a ratio of the surface area of the heat source $A_h$ with the surface area of the spreader plate $A_s$. Typical values of $\lambda$ are in the range of 8 to 12, and are generally used in calculating spreader plate surface area for a given surface area of a heat source. From the standpoint of heat removal efficiency, $\lambda$ should be as low as possible. Highly effective heat transfer surfaces such as highly conductive fins of optimized dimensions and/or the use of heat transfer augmentation means such as reticulated foam provide for relatively low values of $\lambda$. For example, in the present invention, if the surface area of the heat source is 1.5 in$^2$ and the selected area magnification factor is taken as $\lambda=8$ (for highly efficient transfer), then the surface area of the spreader plate will be 8×1.5=12 in$^2$. For a spreader plate of this area, packaging considerations could prescribe a length of the plate in the flow direction to be 4 inches. Then the width of the spreader plate will be 3 inches.

In preferred heat sinks, the fin (and foam) height is optimized according to the following formulas. Based on heat transfer considerations, the optimum fin height (as shown in FIGS. 2A and 3A), b, is determined using the relation, $$b = 0.6498\sqrt{\frac{k_f \delta_f}{h}} \tag{1}$$

where, $k_f$ is the thermal conductivity of the fin material, Btu/ft s ° F.

$\delta_f$ is the fin thickness, ft h is the convective heat transfer coefficient for the foam-filled space bounded by the fins and the spreader plate, Btu/ft$^2$ s ° F., and where, $$h = 1.2704\left[\frac{n^{0.50}}{(1-\phi)^{0.25}}\right]\left(\frac{\rho^{0.50}k^{0.63}c_p^{0.37}}{\mu^{0.13}}\right)u_m^{0.50}\Psi \tag{2}$$

where, n is the linear density of the foam material, pores per ft $\phi$ is the foam porosity expressed as a fraction $\rho$ is the density of the flowing fluid, lb$_m$/ft$^3$ k is the thermal conductivity of the flowing fluid, Btu/ft s ° F.

$c_p$ is the isobaric specific heat of the flowing fluid, Btu/lb$_m$ ° F.

$\mu$ is the dynamic viscosity of the flowing fluid, lb$_m$/ft s $u_m$ is the mean velocity of the flowing fluid, ft/s $\Psi$ is the dimensionless flow efficiency factor The flow efficiency factor $\Psi$ accounts for the secondary flows and coexisting laminar and turbulent flows in the corner region formed by the fins in the center of the spreader plate. For a parallel fin configuration with no corner effect $\Psi=1$, while for the radial fin configuration of the present invention with the corner effect, $\Psi<1$. For heat sinks of the present invention, the preferred value for $\Psi$ is about 0.56.

In the alternative embodiment as shown in FIGS. 3A and 3B, arrays of interrupted blocks fill the areas between adjacent fins replacing the singular continuous blocks as shown in FIGS. 2A and 2B. As shown in FIG. 3B, in this embodiment, the foam length x of an individual short-length block that will maintain a high heat transfer coefficient can be represented as a function of a, the radial length normal to the edge of the spreader plate in the flow direction. While FIG. 3B depicts a heat sink that includes radial fins that are normal to the edge, it will be recognized that alternative configurations contemplated by this invention may include fins that are not perpendicular to the edge of the spreader plate. In such instances, a may be presumed to be equal to half of the length of the spreader plate, or c/2. Also, where the selected spreader plate has a configuration other than the square as depicted in FIG. 3B, it is preferred that a (or c) be selected from the shorter-length side.

Furthermore, it is contemplated that spreader plates of the present invention may have circular or elliptical configurations. In the case of a circular spreader plate, a is preferably equal to the radius, while in the case of an elliptical spreader plate, a is preferably equal to one-half of the minor axis of the ellipse.

The length x is determined as follows. The thermal boundary layer thickness $\delta$ growing from the fin is expressible as $$\delta_t = 3.66\sqrt{\frac{kx}{\rho c_p u_m}} \quad (3)$$

where k is the thermal conductivity of the flowing fluid, Btu/ft s ° F.

x is the length of the foam block, ft $\rho$ is the density of the flowing fluid $lb_m/ft^3$ $c_p$ is the isobaric specific heat of the flowing fluid, $Btu/lb_m$ ° F.

$u_m$ is the mean velocity of the flowing fluid, ft/s

For high heat transfer rate, the thermal boundary layer thickness $\delta_t$ should not be allowed to grow beyond a certain fraction of the length a since $\delta_t$ represents resistance to heat transfer from the fin to the flowing fluid and it is desirable to keep this resistance as low as possible. Thus, $$\delta_t = \beta a \quad (4)$$

where $\beta$ is a dimensionless number having a value in the range of 0.01 and 0.10 for high heat transfer rate.

Eliminating $\delta_t$ between Eqs. (3) and (4), the desired length x of the foam block is, $$x = 0.0747\beta^2 a^2 u_m\left(\frac{\rho c_p}{k}\right) \quad (5)$$

To maximize thermal conduction from the heat source through the spreader plate into the fins and foam, the fins and foam are bonded to one another and the spreader plate. While thermal bonding such as brazing is preferred, any suitable means may be employed including, for example, using a conductive epoxy to form an adhesive bond. In preferred heat sinks of the present invention, the fins, the foam blocks and the spreader plate are assembled and then preferably furnace-brazed to bond the foam to the fins and the spreader plate.

The spreader plate and fins are solid and made from thermal conducting materials known in the art. The reticulated foam is an open cell media and also made from known thermal conducting materials. Preferred thermal conducting materials include aluminum, copper, graphite and aluminum-nitride ceramics. The spreader plate, fins and the reticulated foam may be selected from the same or different materials. In a preferred embodiment, the selected thermal conducting material for the spreader plate, fins and the reticulated foam is aluminum.

The reticulated foam structure is available from commercial sources or may be made by methods known in the art. Suitable processes for making metal foams are disclosed in U.S. Pat. Nos. 3,616,841 and 3,946,039 to Walz, and processes for making ceramic foams are disclosed in U.S. Pat. No. 4,808,558, the teachings of which are incorporated herein by reference. Reticulated foam metal can be formed by the manufacturer to have many shapes, densities and cell sizes. Foam blocks as used herein may be obtained from such manufacturers or cut from larger pieces. Aluminum foams suitable for use herein are available under the tradename DUOCEL from Energy Research and Generation, Inc., Oakland, Calif.

The following examples are provided to illustrate heat sinks of the present invention designed for microelectronic cooling applications using the relationships set forth above and based upon a power dissipation requirement of up to about 200 watts.

EXAMPLE 1

In a heat sink of the present invention using continuous foam blocks, aluminum fins are selected, to be deployed in a radial fin pattern, having a thickness of $\delta_f$=0.125 inch (0.0104 foot) with thermal conductivity $k_f$=133 Btu/ft hr ° F. (0.0369 Btu/ft s ° F.). A commercially available open cell aluminum foam with linear density n=20 pores per inch (240 pores/ft) and porosity $\phi$=0.90 is also selected. The cooling medium is the ambient air flowing with a mean velocity $u_m$=10 ft/s. The value of the flow efficiency factor $\Psi$ is 0.56. The transport properties of the ambient air are as follows.

Density $\rho$=0.0749 $lb_m/ft^3$

Thermal conductivity k=0.0000041 Btu/ft s ° F.

Isobaric specific heat $c_p$=0.2410 $Btu/lb_m$ ° F.

Dynamic viscosity $\mu$=0.0000123 $lb_m$/ft s

To determine optimum fin height, b, the convective heat transfer coefficient, h, is first determined using Equation (2), above, providing, h=0.0175 $Btu/ft^2$ s ° F. Next, introducing this value of h into Equation (1), we obtain the optimum fin height b=0.0964 foot (1.1563 inches).

EXAMPLE 2

This example is the same as Example 1 except that the fin material has been changed from aluminum to copper. The copper fins have a thickness $\delta_f$=0.125 inch (0.0104 foot) with thermal conductivity $k_f$=226 Btu/ft hr ° F. (0.0628 Btu/ft s ° F.). The reticulated foam is a commercially available open cell foam having a linear density n=20 pores per inch (240 pores/ft) and porosity $\phi$=0.90. The cooling medium is the ambient air flowing with a mean velocity $u_m$=10 ft/s. The value of the flow efficiency factor $\Psi$ is 0.56. The transport properties of the ambient air are as follows.

Density $\rho$=0.0749 $lb_m/ft^3$

Thermal conductivity k=0.0000041 Btu/ft s ° F.

Isobaric specific heat $c_p$=0.2410 $Btu/lb_m$ ° F.

Dynamic viscosity $\mu$=0.0000123 $lb_m$/ft s

As in Example 1, using Equation (2), the convective heat transfer coefficient h=0.0175 $Btu/ft^2$s ° F. Then, using Equation (1), we obtain the optimum fin height b=0.1256 foot (1.5073 inches). This optimal height of the copper fin is 30% higher than that for the aluminum fin indicating that for the same fin thickness the copper fin has higher heat dissipation potential than aluminum fin. This can be attributed to the higher thermal conductivity of copper.

EXAMPLE 3

The heat sink of the present invention, using interrupted foam blocks, comprises a square spreader plate admeasuring 4 inches×4 inches with two diagonal fins and two normal fins as shown in FIG. 3B. The maximum distance a between the tips of the diagonal and normal fins along the edge of the spreader plate is 2 inches (⅙ foot). The desired value of the dimensionless number $\beta$ in Eq. (4) can be taken as 0.02615, which falls within the preferred range of 0.01<$\beta$<0.10.

The fluid used for cooling the heat sink is the ambient air flowing with a mean velocity $u_m$ =10 ft/s. The transport properties of the ambient air are as follows.

Density $\rho$=0.0749 $lb_m/ft^3$

Isobaric specific heat $c_p$=0.2410 $Btu/lb_m$ ° F.

Thermal conductivity k=0.0000041 Btu/ft s ° F. From the foregoing values, the desired length x is determined from Eq. (5) to be, x=0.0625 foot, or 0.75 inch.

Based on the calculated values of x=0.75 inch, at least three short blocks would be selected; two may be selected having a length of slightly less (to accommodate for the gap length) than 0.75 inch each and the third having a length of slightly less than 0.50 inch to fit into the total half length of the normal fin of 2.00 inches. Of the three foam blocks thus formed, one would be in the shape of a right triangular and the other two would be shaped as trapezoids.

While the preferred embodiment of the present invention has been described so as to enable one skilled in the art to practice the heat sinks disclosed, it is to be understood that variations and modifications may be employed without departing from the concept and intent of the present invention as defined by the following claims. The preceding description and examples are intended to by exemplary and should not be read to limit the scope of the invention. The scope of the invention should be determined only by reference to the following claims.

What is claimed is:

1. A heat sink for electrical or electronic components comprising:
    a heat spreader plate having a first surface and a second surface in which said first surface includes a recessed area having a volumetric space suitable for connecting and recessing a computer chip and in which said second surface includes a flat area;
    at least three heat conducting fins having equal heights and lengths corresponding to the radial lengths necessary to span the distance from the center of said spreader plate to the edge of said flat area and positioned adjacent to one another in a substantially radial configuration that are connected substantially perpendicular to said flat area of said second surface of said heat spreader plate; and
    an array of heat conducting reticulated foam blocks having heights about equal to said fins that are positioned in-between at least two adjacent radial fins wherein said foam blocks between said at least two adjacent radial fins are spaced one from another in a like radial direction such that each two adjacent ones of said foam blocks define a gap therebetween.

2. A heat sink of claim 1 wherein said fins are positioned about equidistant from one another around said spreader plate.

3. A heat sink of claim 1 wherein said array of heat conducting reticulated foam blocks are positioned in-between each two adjacent radial fins around said spreader plate.

4. A heat sink of claim 3 wherein said foam blocks have a common radial length of less than or equal to x, in the flow direction, in which $$x = 0.0747\beta^2 a^2 u_m \left(\frac{\rho c_p}{k}\right)$$

where,
    k is the thermal conductivity of the flowing fluid, Btu/ft s ° F.
    a is the radial distance measured from the center of the spreader plate to its edge, ft
    ρ is the density of the flowing fluid $lb_m/ft^3$
    $c_p$ is the isobaric specific heat of the flowing fluid, $Btu/lb_m$ ° F.
    $u_m$ is the mean velocity of the flowing fluid, ft/s
    β is a dimensionless number having a value in the range of 0.01 to 0.10.

5. A heat sink of claim 4 wherein the fin height, b, is determined by the relationship, $$b = 0.6498 \sqrt{\frac{k_f \delta_f}{h}}$$

where,
    $k_f$ is the thermal conductivity of the selected fin material, Btu/ft s ° F.
    $\delta_f$ is the fin thickness, ft
    h is the convective heat transfer coefficient for the foam-filled space bounded by the fins and the spreader plate, $Btu/ft^2$ s ° F., and where h is given by the formula, $$h = 1.2704 \left[\frac{n^{0.50}}{(1-\phi)^{0.25}}\right] \left(\frac{\rho^{0.50} k^{0.63} c_p^{0.37}}{\mu^{0.13}}\right) u_m^{0.50} \Psi$$

where,
    n is the linear density of the foam material, pores per ft
    ϕ is the foam porosity expressed as a fraction
    ρ p is the density of the flowing fluid, $lb_m/ft^3$
    k is the thermal conductivity of the flowing fluid, Btu/ft s ° F.
    $c_p$ is the isobaric specific heat of the flowing fluid, $Btu/lb_m$ ° F.
    μ is the dynamic viscosity of the flowing fluid, $lb_m/ft$ s
    $u_m$ is the mean velocity of the flowing fluid, ft/s
    Ψ is <1.

6. A heat sink of claim 5 wherein Ψ=0.56.

7. A heat sink of claim 1 wherein said heat spreader plate, said fins and said heat conducting foam are made from aluminum, copper, graphite or aluminum-nitride ceramic.

8. A heat sink of claim 5 wherein said heat spreader plate, said fins and said heat conducting foam are made from aluminum.

9. A method of making a heat sink for electrical or electronic components comprising a heat spreader plate, at least three fins and reticulated foam blocks comprising,
    selecting a spreader plate made from a heat conducting material having a first surface and a second surface in which said first surface includes a recessed area having a volumetric space suitable for connecting and recessing a computer chip and a second surface that includes a flat area, selecting fins made from a heat conducting material having equal heights and lengths corresponding to the radial lengths necessary to span the distance from the center of said spreader plate to the edge of said flat area, and selecting reticulated foam blocks having a configuration suitable for placement in-between at least two adjacent radial fins and connection to said flat area of said second surface,
    assembling said fins and said foam blocks onto said flat area of said second surface so that said fins are arranged adjacent to one another in a substantially radial configuration and substantially perpendicular to said spreader plate and said foam blocks are positioned in order of increasing width from the center of said spreader plate such that said foam blocks are spaced one from another in a like radial direction such that each two adjacent ones of said foam blocks define a gap therebetween, and
    bonding the assembly of said fins and said foam blocks to said flat area of said second surface of said spreader plate.

10. A method of claim 9 wherein said fins are arranged at about equal distances from one another around said spreader plate.

11. A method of claim 9 wherein said foam blocks are positioned in-between each two adjacent radial fins around said spreader plate.

12. A method of claim 9 wherein said bonding is accomplished using a thermally conductive adhesive or furnace brazing.

13. A method of claim 11 wherein said foam blocks have a common radial length of less than or equal to x, in the flow direction, in which $$x = 0.0747\beta^2 a^2 u_m\left(\frac{\rho c_p}{k}\right)$$

where, k is the thermal conductivity of the flowing fluid, Btu/ft s ° F.

a is the radial distance measured from the center of the spreader plate to its edge, ft $\rho$ is the density of the flowing fluid $lb_m/ft^3$ $c_p$ is the isobaric specific heat of the flowing fluid, $Btu/lb_m$ ° F.

$u_m$ is the mean velocity of the flowing fluid, ft/s $\beta$ is a dimensionless number having a value in the range of 0.01 to 0.10.

14. A method of claim 13 wherein the fin height, b, is determined by the relationship, $$b = 0.6498\sqrt{\frac{k_f \delta_f}{h}}$$

where, $k_f$ is the thermal conductivity of the selected fin material, Btu/ft s ° F.

$\delta_f$ is the fin thickness, ft h is the convective heat transfer coefficient for the foam-filled space bounded by the fins and the spreader plate, $Btu/ft^2$ s ° F., and where h is given by the formula, $$h = 1.2704\left[\frac{n^{0.50}}{(1-\phi)^{0.25}}\right]\left(\frac{\rho^{0.50}k^{0.63}c_p^{0.37}}{\mu^{0.13}}\right)u_m^{0.50}\Psi$$

where, n is the linear density of the foam material, pores per ft $\phi$ is the foam porosity expressed as a fraction $\rho$ is the density of the flowing fluid, $lb_m/ft^3$ k is the thermal conductivity of the flowing fluid, Btu/ft s ° F.

$c_p$ is the isobaric specific heat of the flowing fluid, $Btu/lb_m$ ° F.

$\mu$ is the dynamic viscosity of the flowing fluid, $lb_m/ft$ s $u_m$ is the mean velocity of the flowing fluid, ft/s $\Psi$ is <1.

15. A method of claim 14 wherein $\Psi=0.56$.

16. A method of claim 14 wherein said heat spreader plate, said fins and said foam blocks are made from aluminum, copper, graphite or aluminum-nitride ceramic.

17. A method of claim 14 wherein said heat spreader plate, said fins and said heat conducting foam are made from aluminum.

18. A method of cooling a computer chip by attaching the computer chip to a first side of a heat sink and passing a cooling fluid over a second side of the heat sink, wherein said heat sink comprises, a heat spreader plate having a first surface and a second surface in which said first surface includes a recessed area having a volumetric space suitable for connecting and recessing said computer chip and in which said second surface includes a flat area;

at least three heat conducting fins having equal heights and lengths corresponding to the radial lengths necessary to span the distance from the center of said spreader plate to the edge of said flat area and positioned adjacent to one another in a substantially radial configuration and about equidistant from one another that are connected substantially perpendicular to said flat area of said second surface of said heat spreader plate; and an array of heat conducting reticulated foam blocks having heights about equal to said fins that are positioned in-between each two adjacent radial fins wherein said foam blocks are spaced one from another in a like radial direction such that each two adjacent ones of said foam blocks define a gap therebetween; and wherein said foam blocks have a common radial length of less than or equal to x, in the flow direction, in which $$x = 0.0747\beta^2 a^2 u_m\left(\frac{\rho c_p}{k}\right)$$

where, k is the thermal conductivity of the flowing fluid, Btu/ft s ° F.

a is the radial distance measured from the center of the spreader plate to its edge, ft $\rho$ is the density of the flowing fluid $lb_m/ft^3$ $c_p$ is the isobaric specific heat of the flowing fluid, $Btu/lb_m$ ° F.

$u_m$ is the mean velocity of the flowing fluid, ft/s $\beta$ is a dimensionless number having a value in the range of 0.01 to 0.10; and, wherein the height of said fins, b, and is determined by the relationship, $$b = 0.6498\sqrt{\frac{k_f \delta_f}{h}}$$

where, $k_f$ is the thermal conductivity of the selected fin material, Btu/ft s ° F.

$\delta_f$ is the fin thickness, ft h is the convective heat transfer coefficient for the foam filled space bounded by the fins and the spreader plate, $Btu/ft^2$ S ° F., and where h is given by the formula, $$h = 1.2704\left[\frac{n^{0.50}}{(1-\phi)^{0.25}}\right]\left(\frac{\rho^{0.50}k^{0.63}c_p^{0.37}}{\mu^{0.13}}\right)u_m^{0.50}\Psi$$

where, n is the linear density of the foam material, pores per ft $\phi$ is the foam porosity expressed as a fraction $\rho$ is the density of the flowing fluid, $lb_m/ft^3$ k is the thermal conductivity of the flowing fluid, Btu/ft s ° F.

$c_p$ is the isobaric specific heat of the flowing fluid, $Btu/lb_m$ ° F.

$\mu$ is the dynamic viscosity of the flowing fluid, $lb_m/ft$ s $u_m$ is the mean velocity of the flowing fluid, ft/s $\Psi=0.56$.

19. A method of claim 18 wherein the cooling fluid is air and the heat sink is made from aluminum materials.

* * * * *